(12) United States Patent
Sun

(10) Patent No.: US 10,205,116 B2
(45) Date of Patent: Feb. 12, 2019

(54) ORGANIC LIGHT EMITTING DIODE ARRAY SUBSTRATE, METHOD FOR MANUFACTURING THE SAME, PACKAGING STRUCTURE AND DISPLAY DEVICE

(71) Applicant: BOE TECHNOLOGY GROUP CO., LTD., Beijing (CN)

(72) Inventor: Liang Sun, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/039,639

(22) PCT Filed: Nov. 17, 2015

(86) PCT No.: PCT/CN2015/094767
§ 371 (c)(1),
(2) Date: May 26, 2016

(87) PCT Pub. No.: WO2016/101731
PCT Pub. Date: Jun. 30, 2016

(65) Prior Publication Data
US 2017/0170423 A1   Jun. 15, 2017

(30) Foreign Application Priority Data

Dec. 26, 2014   (CN) .......................... 2014 1 0832038

(51) Int. Cl.
*H01L 35/24* (2006.01)
*H01L 51/52* (2006.01)
(Continued)

(52) U.S. Cl.
CPC ...... *H01L 51/5221* (2013.01); *H01L 27/3246* (2013.01); *H01L 51/0021* (2013.01);
(Continued)

(58) Field of Classification Search
CPC .................... H01L 27/3246; H01L 51/5221
See application file for complete search history.

(56) References Cited

U.S. PATENT DOCUMENTS 7,969,086 B2 * 6/2011 Kim ..................... H01L 27/3276
                                                                    313/504
9,142,598 B2   9/2015 Ohnuma et al.
(Continued)

FOREIGN PATENT DOCUMENTS

| CN | 103022378 A | 4/2013 |
|---|---|---|
| CN | 103943663 A | 7/2014 |

(Continued)

OTHER PUBLICATIONS

International Search Report and Written Opinion of the International Searching Authority regarding Application No. PCT/CN2015/094767, dated Feb. 6, 2016. Translation provided by Dragon Intellectual Property Law Firm.
(Continued)

*Primary Examiner* — Samuel Gebremariam
(74) *Attorney, Agent, or Firm* — Harness, Dickey & Pierce, P.L.C.

(57) ABSTRACT

An OLED array substrate and a method for manufacturing the same, an OLED packaging structure and a display device are provided by the present disclosure. The OLED array substrate includes thin film transistors, anodes, cathodes and organic light-emitting layers arranged between the anodes and the cathodes. The OLED array substrate further includes spacers configured to support the OLED array substrate and a packaging substrate so as to form a cell gap therebetween. Each cathode includes a first region which covers the corresponding first spacer and a second region beyond the first regions, and a thickness of the cathode at the first region is larger than a thickness of the cathode at the second region.

15 Claims, 2 Drawing Sheets

(51) Int. Cl.
*H01L 27/32* (2006.01)
*H01L 51/00* (2006.01)

(52) U.S. Cl.
CPC .......... *H01L 51/524* (2013.01); *H01L 51/525* (2013.01); *H01L 51/5225* (2013.01); *H01L 51/5246* (2013.01); *H01L 27/3244* (2013.01); *H01L 2251/558* (2013.01)

(56) References Cited

U.S. PATENT DOCUMENTS

| | | | |
|---|---|---|---|
| 2011/0241027 A1* | 10/2011 | Kaneta | H01L 27/3246 257/88 |
| 2013/0187139 A1 | 7/2013 | Sagawa | |
| 2014/0167012 A1 | 6/2014 | Sun et al. | |

FOREIGN PATENT DOCUMENTS

| | | |
|---|---|---|
| CN | 104064686 A | 9/2014 |
| CN | 104465709 A | 3/2015 |
| CN | 204257656 U | 4/2015 |
| EP | 2182564 A1 | 5/2010 |

OTHER PUBLICATIONS

Office Action regarding Chinese Patent Application No. 201410832038.5, dated Oct. 28, 2016. Translation provided by Dragon Intellectual Property Law Firm.

European Search Report regarding Application No. 15860030.4 dated Jul. 17, 2018.

\* cited by examiner

ORGANIC LIGHT EMITTING DIODE ARRAY SUBSTRATE, METHOD FOR MANUFACTURING THE SAME, PACKAGING STRUCTURE AND DISPLAY DEVICE

CROSS-REFERENCE TO RELATED APPLICATION

This application is the U.S. national phase of PCT Application No. PCT/CN2015/094767 filed on Nov. 17, 2015, which claims a priority of the Chinese Patent Application No. 201410832038.5 filed on Dec. 26, 2014, the disclosures of which are incorporated in their entirety by reference herein.

TECHNICAL FIELD

The present disclosure relates to the field of display technology, and in particular to an organic light emitting diode (OLED) array substrate and a method for manufacturing the same, an OLED packaging structure and a display device.

BACKGROUND

OLED apparatus has the advantages such as all-solid-state structure, high brightness, full viewing angle, quick response, wide working temperature range, capable of achieving flexible display, and therefore has become a competitive and promising new generation of display technology. The organic light emitting material and the cathode material of the OLED apparatus are sensitive to moisture and oxygen, a service life of the OLED apparatus may be influenced adversely in a wet or high-oxygen-content environment.

In order to prevent moisture and oxygen from influencing adversely the OLED apparatus, the OLED apparatus is required to be packaged. In the process of packaging, the OLED array substrate is adhered to a packaging substrate by a sealant, thereby to form a sealed apparatus structure and block moisture and oxygen in the air. A spacer is arranged between the OLED array substrate and the packaging substrate, so to support them and form a cell gap therebetween.

A top light-emitting OLED apparatus is generally provided with a relative thin cathode so as to achieve a relative high light transmittance. However, a surface of the OLED array substrate is not even, a lap joint of the thin cathode may be poor at an uneven portion of the surface of the OLED array substrate (e.g., where the spacers are located), therefore a cathode resistance may be increased and a power consumption of the OLED array substrate may be increased as a result. Nevertheless, the light transmittance of the OLED array substrate may be decreased and then the display effect may be influenced adversely if the cathode is thick.

SUMMARY

An object of the present disclosure is to provide an OLED array substrate and a method for manufacturing the same, an OLED packaging structure and a display device, so as to make the lap joint of the cathode firm and reduce the power consumption of the OLED array substrate without reducing the light transmittance of the OLED array substrate.

In one aspect, an OLED array substrate is provided, including thin film transistors, anodes, cathodes and organic light-emitting layers arranged between the anodes and the cathodes. The OLED array substrate further includes first spacers configured to support the OLED array substrate and a packaging substrate so as to form a cell gap therebetween. Each cathode includes a first region which covers the corresponding first spacer and a second region beyond the first regions, and a thickness of the cathode at the first region is larger than a thickness of the cathode at the second region.

Optionally, the cathodes at the first regions are of an identical thickness, and the cathodes at the second regions are of an identical thickness.

Optionally, the cathode at each first region is of a thickness larger than the cathode at each second region by 1 to 20 nanometers.

In another aspect, an OLED packaging structure is further provided, including the OLED array substrate hereinabove and a packaging substrate.

Optionally, an edge of the OLED array substrate is adhered to an edge of the packaging substrate by a sealant.

Optionally, the OLED packaging structure further includes second spacers configured to support the OLED array substrate and the packaging substrate so as to form a cell gap therebetween. The second spacers are arranged in the sealant.

In yet another aspect, a display device is further provided, including the OLED packaging structure hereinabove.

In still yet another aspect, a method for manufacturing an OLED array substrate is further provided. The OLED array substrate includes thin film transistors, anodes, cathodes and organic light-emitting layers arranged between the anodes and the cathodes, and the OLED array substrate further includes spacers configured to support the OLED array substrate and a packaging substrate so as to form a cell gap therebetween. The method includes forming the cathodes on a substrate provided with the spacers, the thin film transistors, the anodes and the organic light-emitting layers, wherein each cathode includes a first region which covers the corresponding spacer and a second region beyond the first region, a thickness of the cathode at each first region is larger than a thickness of the cathode at each second region.

Optionally, the step of forming the cathodes includes forming a first cathode pattern corresponding to the first regions and the second regions on the substrate provided with the spacers, the thin film transistors, the anodes and the organic light-emitting layers; and forming, on the first cathode pattern, a second cathode pattern corresponding to the first regions, wherein the cathodes are formed by the first and the second cathode patterns.

Optionally, the step of forming, on the first cathode pattern, the second cathode pattern corresponding to the first regions includes attaching the substrate provided with the first cathode pattern and an evaporation mask closely, the evaporation mask including openings corresponding to the first regions; and forming the second cathode pattern on the substrate through evaporation using a cathode evaporating source arranged opposite to the evaporation mask.

The surface of the OLED array substrate is not even at the regions of the spacers. According to the embodiments of the present disclosure, the cathodes at the regions where the spacers are located are thickened without changing the thicknesses of the cathodes at the other regions, so as to make the lap joint of the cathode at an uneven portion of the surface of the OLED apparatus firm and reduce the cathode resistance without reducing the light transmittance of the cathodes at the light-emitting regions, thereby to reduce a power consumption of the OLED array substrate.

DETAILED DESCRIPTION

In order to make the objects, the technical solutions and the advantages of the present disclosure more apparent, the present disclosure will be described hereinafter in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in some embodiments an OLED array substrate and a method for manufacturing the same, an OLED packaging structure and a display device, so as to make the lap joint of the cathode firm and reduce the power consumption of the OLED array substrate without reducing the light transmittance of the OLED array substrate.

Figure 1:
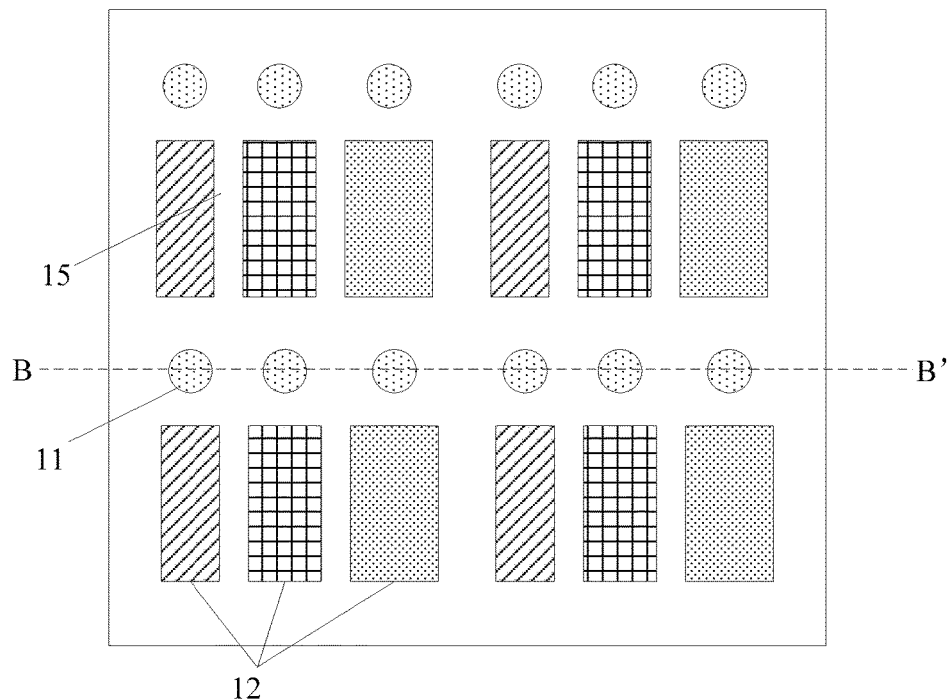
FIG. 1 is a plan view of an OLED array substrate.
Figure 2:
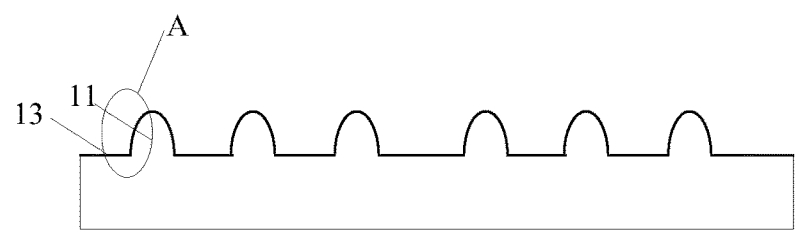
FIG. 2 is a sectional view of the OLED array substrate shown in FIG. 1 along line B-B'.
Figure 3:
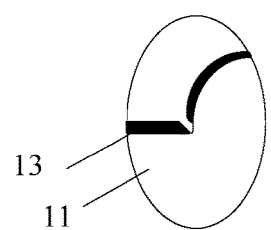
FIG. 3 is an enlarged view of the portion A of the OLED array substrate shown in FIG. 2.

FIG. 1 is a plan view of an OLED array substrate. FIG. 2 is a sectional view of the OLED array substrate shown in FIG. 1 along Line B-B'. FIG. 3 is an enlarged view of the portion A of the OLED array substrate shown in FIG. 2.

Thin film transistors, pixel definition layers, anodes, organic functional layers and cathodes are formed on the OLED array substrate. The pixel definition layer defines a plurality of sub-pixels 12. A top light-emitting OLED apparatus is generally provided with relative thin cathodes 13 so as to achieve a relative high light transmittance. However, the OLED array substrate need to be packaged with a packaging substrate, so spacers 11 are needed to be arranged between the OLED array substrate and the packaging substrate to support them and then form a cell gap therebetween. Each spacer 11 includes a planarization layer resin and a pixel definition layer resin formed in advance of the cathodes. The cathodes 13 cover the spacers 11. Each spacer 11 is of a certain thickness, so the surface of the OLED array substrate is uneven at the regions where the spacers 11 are located and nearby. As shown in FIG. 3, a lap joint of a relative thin cathode may be poor at each spacer 11, and then a resistance of each cathode 13 may be increased and a power consumption of the OLED array substrate may be increased as a result. Nevertheless, the light transmittance of the OLED array substrate may be decreased and then the display effect may be influenced adversely if the cathode is thick.

In view of this, an OLED array substrate is provided in some embodiments of the present disclosure, including thin film transistors, anodes, cathodes and organic light-emitting layers arranged between the anodes and the cathodes. The OLED array substrate further includes first spacers configured to support the OLED array substrate and a packaging substrate so as to form a cell gap therebetween. Each cathode includes a first region which covers the corresponding first spacer and a second region beyond the first regions, and a thickness of the cathode at the first region is larger than a thickness of the cathode at the second region.

The surface of the OLED array substrate is not even at the regions where the spacers are located. According to the present disclosure, the cathodes at the regions where the spacers are located are thickened without changing the thicknesses of the cathodes at the other regions, so as to make the lap joint of the cathode at an uneven portion of the surface of the OLED apparatus firm and reduce the cathode resistance without reducing the light transmittance of the cathodes at the light-emitting regions, thereby to reduce a power consumption of the OLED array substrate.

Figure 4:
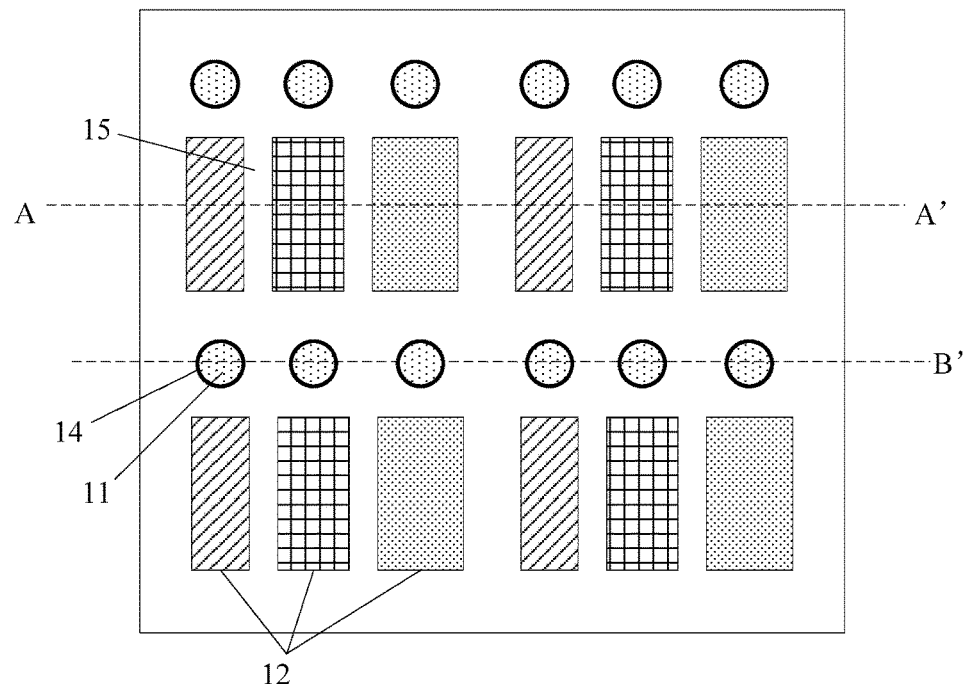
FIG. 4 is a plan view of an OLED array substrate according to some embodiments of the present disclosure.
Figure 5:
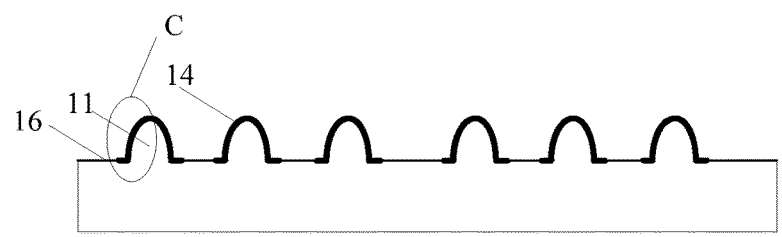
FIG. 5 is a sectional view of the OLED array substrate shown in FIG. 4 along line B-B'.
Figure 6:
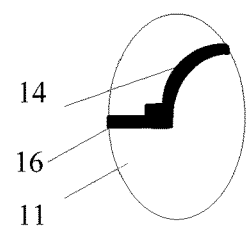
FIG. 6 is an enlarged view of the portion C of the OLED array substrate shown in FIG. 5.

FIG. 4 is a plan view of an OLED array substrate according to some embodiments of the present disclosure. FIG. 5 is a sectional view of the OLED array substrate shown in FIG. 4 along Line B-B'. FIG. 6 is an enlarged view of the portion C of the OLED array substrate shown in FIG. 5. As shown in FIGS. 5 and 6, each cathode of the OLED array substrate includes a first region which covers the corresponding first spacer 11 and a second region beyond the first regions, and a thickness of the cathode 14 at the first region is larger than a thickness of the cathode 16 at the second region.

Furthermore, the cathodes 14 at the first regions are of an identical thickness, and the cathodes 16 at the second regions are of an identical thickness. To be specific, the cathode 14 at each first region is of a thickness larger than the cathode 16 at each second region by 1 to 20 nanometers. In some embodiments of the present disclosure, only a part of each cathodes are thickened, so as to make the lap joint of the cathode at an uneven portion of the surface of the OLED apparatus firm and reduce the cathode resistance without influencing adversely the light transmittance of the cathodes at the light-emitting regions, thereby to reduce a power consumption of the OLED array substrate.

An OLED packaging structure is further provided in some embodiments of the present disclosure, including the OLED array substrate hereinabove and a packaging substrate.

An edge of the OLED array substrate is adhered to an edge of the packaging substrate by a sealant. The OLED packaging structure further includes second spacers configured to support the OLED array substrate and the packaging substrate so as to form a cell gap therebetween. The second spacers are arranged in the sealant.

Each spacer is of a certain thickness, so the surface of the OLED array substrate is not even at the regions where the spacers are located. According to the embodiments of the present disclosure, the cathodes at the regions where the spacers are located are thickened without changing the thicknesses of the cathodes at the other regions, so as to make the lap joint of the cathode at an uneven portion of the surface of the OLED apparatus firm and reduce the cathode resistance without reducing the light transmittance of the cathodes at the light-emitting regions, thereby to reduce a power consumption of the OLED array substrate.

A display device is further provided in some embodiments of the present disclosure, including the OLED packaging structure hereinabove. The display device may be any product or component with a display function such as cell phones, tablet PCs, televisions, displayers, laptop computers, digital frames and navigators.

FIG. 1 is a plan view of an OLED array substrate. FIG. 2 is a sectional view of the OLED array substrate shown in FIG. 1 along Line B-B'. FIG. 3 is an enlarged view of the portion A of the OLED array substrate shown in FIG. 2.

Thin film transistors, pixel definition layers, anodes, organic functional layers and cathodes are formed on the OLED array substrate. The pixel definition layer defines a plurality of sub-pixels 12. A top light-emitting OLED apparatus is generally provided with relative thin cathodes 13 so as to achieve a relative high light transmittance. However, the OLED array substrate need to be packaged with a packaging substrate, so spacers 11 are arranged between the OLED array substrate and the packaging substrate to support them and then form a cell gap therebetween. Each spacer 11 includes a planarization layer resin and a pixel definition layer resin formed in advance of the cathodes. The cathodes 13 cover the spacers 11. Each spacer 11 is of a certain thickness, so the surface of the OLED array substrate is uneven at the regions where the spacers 11 are located. As shown in FIG. 3, a lap joint of a relative thin cathode may be poor at each spacer 11, and then a resistance of each cathode 13 may be increased and a power consumption of the OLED array substrate may be increased as a result. Nevertheless, the light transmittance of the OLED array substrate may be decreased and then the display effect may be influenced adversely if the cathode is thick.

In view of this, a method for manufacturing an OLED array substrate is further provided. The OLED array substrate includes thin film transistors, anodes, cathodes and organic light-emitting layers arranged between the anodes and the cathodes. The OLED array substrate further includes spacers configured to support the OLED array substrate and a packaging substrate so as to form a cell gap therebetween. The method includes forming the cathodes on a substrate provided with the spacers, the thin film transistors, the anodes and the organic light-emitting layers, wherein each cathode includes a first region which covers the corresponding spacer and a second region beyond the first region, a thickness of the cathode at each first region is larger than a thickness of the cathode at each second region.

FIG. 4 is a plan view of an OLED array substrate according to some embodiments of the present disclosure. FIG. 5 is a sectional view of the OLED array substrate shown in FIG. 4 along Line B-B'. FIG. 6 is an enlarged view of the portion C of the OLED array substrate shown in FIG. 5. As shown in FIGS. 5 and 6, each cathode of the OLED array substrate includes a first region which covers the corresponding first spacer 11 and a second region beyond the first regions, and a thickness of the cathode 14 at the first region is larger than a thickness of the cathode 16 at the second region.

Furthermore, the cathodes 14 at the first regions are of an identical thickness, and the cathodes 16 at the second regions are of an identical thickness. To be specific, the cathode 14 at each first region is of a thickness larger than the cathode 16 at each second region by 1 to 20 nanometers.

Furthermore, the step of forming the cathodes includes forming a first cathode pattern corresponding to the first regions and the second regions on the substrate provided with the spacers, the thin film transistors, the anodes and the organic light-emitting layers; and forming, on the first cathode pattern, a second cathode pattern corresponding to the first regions, wherein the cathodes are formed by the first and the second cathode patterns.

As compared with the second regions, the first regions further include a second cathode pattern, so the cathode at each first region is of a thickness larger than the cathode at each second region.

To be specific, the second cathode pattern may be formed on substrate arranged with the first cathode pattern by evaporation. The step of forming, on the first cathode pattern, the second cathode pattern corresponding to the first regions includes attaching the substrate provided with the first cathode pattern and an evaporation mask closely, the evaporation mask including openings corresponding to the first regions; and forming the second cathode pattern on the substrate through evaporation using a cathode evaporating source arranged opposite to the evaporation mask.

In some embodiments of the present disclosure, only a part of each cathodes is thickened, so as to make the lap joint of the cathode at an uneven portion of the surface of the OLED apparatus firm and reduce the cathode resistance without influencing adversely the light transmittance of the cathodes at the light-emitting regions, thereby to reduce a power consumption of the OLED array substrate.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. An organic light emitting diode (OLED) packaging structure, comprising:
    an OLED array substrate;
    thin film transistors;
    anodes;
    cathodes;
    organic light-emitting layers arranged between the anodes and the cathodes, and
    a packaging substrate opposite to the OLED array substrate,
    wherein the thin film transistors, the anodes and the cathodes are arranged between the OLED array substrate and the packaging substrate,
    wherein the OLED packaging structure further comprises first spacers configured to support the OLED array substrate and the packaging substrate to form a cell gap between the OLED array substrate and the packaging substrate,
    each of the cathodes comprises a plurality of first regions and a second region beyond the plurality of first regions, each of the plurality of first regions covers a corresponding first spacer of the first spacers, and a thickness of each of the plurality of first regions of the cathode is larger than a thickness of the second region of the cathode, and a projection of each of the first spacers on the OLED array substrate completely falls within a projection of one of the plurality of first regions corresponding to the first spacer.

2. The OLED packaging structure according to claim 1, wherein an edge of the OLED array substrate is adhered to an edge of the packaging substrate by a sealant.

3. The OLED packaging structure according to claim 2, further comprising second spacers configured to support the OLED array substrate and the packaging substrate so as to form a cell gap between the OLED array substrate and the packaging substrate, wherein the second spacers are arranged in the sealant.

4. A display device, comprising the OLED packaging structure according to claim 1.

5. The display device according to claim 4, wherein an edge of the OLED array substrate is adhered to an edge of the packaging substrate by a sealant.

6. The display device according to claim 5, further comprising second spacers configured to support the OLED array substrate and the packaging substrate so as to form a cell gap between the OLED array substrate and the packaging substrate, the second spacers being arranged in the sealant.

7. The display device according to claim 4, wherein first regions of the cathodes are of an identical thickness, and second regions of the cathodes are of an identical thickness.

8. The display device according to claim 7, wherein a thickness of each of the plurality of first regions of the cathode is larger than a thickness of the second region of the cathode by 1 to 20 nanometers.

9. The OLED packaging structure according to claim 1, wherein the first regions of the cathodes are of an identical thickness, and the second regions of the cathodes are of an identical thickness.

10. The OLED packaging structure according to claim 9, wherein a thickness of each of the plurality of first regions of the cathode is larger than a thickness of the second region of the cathode by 1 to 20 nanometers.

11. A method for manufacturing an organic light emitting diode (OLED) packaging structure, comprising: an OLED array substrate; thin film transistors; anodes; cathodes; organic light-emitting layers arranged between the anodes and the cathodes, and a packaging substrate opposite to the OLED array substrate, wherein the thin film transistors, the anodes and the cathodes are arranged between the OLED array substrate and the packaging substrate, wherein the OLED packaging structure further comprises first spacers configured to support the OLED array substrate and the packaging substrate to form a cell gap between the OLED array substrate and the packaging substrate, the method comprises:
forming the cathodes on a substrate provided with the first spacers, the thin film transistors, the anodes and the organic light-emitting layers, wherein each of the cathodes comprises a plurality of first regions and a second region beyond the plurality of first regions, each of the plurality of first regions covers a corresponding first spacer of the first spacers, and a thickness of each of the plurality of first regions of the cathode is larger than a thickness of the second region of the cathode, and a projection of each of the first spacers on the OLED array substrate completely falls within a projection of one of the plurality of first regions corresponding to the first spacer.

12. The method according to claim 11, wherein the step of forming the cathodes comprises:
forming a first cathode pattern corresponding to the plurality of first regions and the second region on the OLED array substrate provided with the first spacers, the thin film transistors, the anodes and the organic light-emitting layers; and
forming, on the first cathode pattern, a second cathode pattern corresponding to the plurality of first regions, wherein the cathodes are formed by the first and the second cathode patterns.

13. The method according to claim 12, wherein the step of forming, on the first cathode pattern, the second cathode pattern corresponding to the plurality of first regions comprises:
attaching the OLED array substrate provided with the first cathode pattern and an evaporation mask closely, the evaporation mask comprising openings corresponding to the plurality of first regions; and
forming the second cathode pattern on the OLED array substrate through evaporation using a cathode evaporating source arranged opposite to the evaporation mask.

14. The method according to claim 11, wherein the cathode at the plurality of first regions is of an identical thickness, the cathode at the second regions is of an identical thickness.

15. The method according to claim 11, wherein a thickness of each of the plurality of first regions of the cathode is larger than a thickness of the second region of the cathode by 1 to 20 nanometers.

\* \* \* \* \*